United States Patent
Choi

(10) Patent No.: US 9,419,603 B2
(45) Date of Patent: Aug. 16, 2016

(54) GATE DRIVER, DRIVING METHOD THEREOF, AND CONTROL CIRCUIT OF FLAT PANEL DISPLAY DEVICE

(71) Applicant: SILICON WORKS CO., LTD., Daejeon-si (KR)

(72) Inventor: Jeung Hie Choi, Cheongju-si (KR)

(73) Assignee: SILICON WORKS CO., LTD., Daejeon-Si (KR)

(*) Notice: Subject to any disclaimer, the term of this patent is extended or adjusted under 35 U.S.C. 154(b) by 0 days.

(21) Appl. No.: 14/528,288

(22) Filed: Oct. 30, 2014

(65) Prior Publication Data
US 2015/0116009 A1    Apr. 30, 2015

(30) Foreign Application Priority Data
Oct. 31, 2013    (KR) .................. 10-2013-0131265

(51) Int. Cl.
| H03K 17/16 | (2006.01) |
| H03K 4/94 | (2006.01) |
| H05B 33/08 | (2006.01) |

(52) U.S. Cl.
CPC .............. *H03K 17/165* (2013.01); *H03K 4/94* (2013.01); *H05B 33/086* (2013.01)

(58) Field of Classification Search
CPC ... H03K 19/007; H03K 17/165; H03K 21/02; H03K 5/133; H03K 5/14; H05B 33/083; H05B 33/086
USPC .......... 327/108, 109, 117, 156; 326/38, 41, 63
See application file for complete search history.

(56) References Cited

U.S. PATENT DOCUMENTS

| 8,106,873 | B2 | 1/2012 | Cheng et al. |
| 8,149,025 | B2 * | 4/2012 | Huang ................. G09G 3/3677 326/21 |
| 2011/0102406 | A1 | 5/2011 | Wang et al. |
| 2012/0194497 | A1 | 8/2012 | Wu |
| 2013/0113776 | A1 | 5/2013 | Ding et al. |

FOREIGN PATENT DOCUMENTS

| KR | 10-2011-0077211 | 7/2011 |
| KR | 10-2011-0077868 | 7/2011 |
| KR | 10-1324428 | 10/2013 |

* cited by examiner

*Primary Examiner* — John Poos
(74) *Attorney, Agent, or Firm* — Kile Park Reed & Houtteman PLLC

(57) ABSTRACT

The present invention discloses a gate driver which employs gate pulse modulation technology for improving an image quality, a driving method thereof, and a control circuit of a flat panel display device employing the gate driver. The gate driver is configured to modulate a gate pulse therein, and output the modulated gate pulse.

15 Claims, 9 Drawing Sheets

GATE DRIVER, DRIVING METHOD THEREOF, AND CONTROL CIRCUIT OF FLAT PANEL DISPLAY DEVICE

BACKGROUND

1. Technical Field

The present disclosure relates to a flat display device, and more particularly, to a gate driver which employs gate pulse modulation technology for improving an image quality, a driving method thereof, and a control circuit of a flat panel display device employing the gate driver.

2. Related Art

Recently, a variety of flat panel display devices have widely spread, and examples of the flat panel display devices may include a liquid crystal display (LCD) device, a light emitting diode (LED) display device, an organic LED (OLED) display device and the like.

Representatively, the LCD display device includes a liquid crystal panel and a driving circuit for driving the liquid crystal panel. The liquid crystal panel includes a plurality of gate lines and source lines intersecting each other, and pixels are defined at the respective intersections between the gate lines and the source lines. Each of the pixels is configured to switch a thin film transistor according to a gate pulse transmitted through a gate line, and represent an image according to a source signal transmitted through a source line and the thin film transistor.

The driving circuit includes a source driver for driving a source signal to a source line, a gate driver for driving a gate pulse to a gate line, and a timing controller for controlling the operations of the source driver and the gate driver. Furthermore, the driving circuit includes a voltage supply circuit configured to provide a voltage to the source driver, the gate driver, and the timing controller.

In general, when the thin film transistor of the LCD display device is turned off, a pixel voltage stored in each pixel may be changed according to a gate voltage variation of a parasitic capacitor included in the thin film transistor. More specifically, as soon as the thin film transistor is turned off, kick back may occur so that the charge stored in the pixel leaks through the parasitic capacitor of the thin film transistor. The kickback may destabilize an output of a gate pulse. As a result, the image quality of a pixel driven by the gate pulse may be degraded.

In order to solve the above-described phenomenon, gate pulse modulation technology has been developed. The gate pulse modulation technology is to control turn-off of a thin film transistor using a modulated gate pulse.

The gate pulse modulation technology may generate power such that the power supply circuit has a gate pulse modulation waveform to modulate a gate pulse, and supply the generated power to gate drivers, and the gate drivers may output a modulated gate pulse using the power having a gate pulse modulation waveform. In this case, the power having a gate pulse modulation waveform is supplied to the gate driver through a high voltage power line for driving a gate.

The plurality of gate drivers are sequentially enabled, and sequentially output gate pulses to the respective gate lines of the liquid crystal panel.

When the power having a gate pulse modulation waveform is supplied to the gate drivers which are sequentially operated, the power supply circuit is configured to provide the power having a gate pulse modulation waveform to the entire gate drivers through the high voltage power line which is commonly coupled to the gate drivers.

That is, the power having a gate pulse modulation waveform is supplied regardless of the enable states of the gate drivers. As a result, the power may also be supplied to a gate driver which is not driven. Thus, the charge and discharge by the gate pulse modulation waveform are continuously performed in the high voltage power line for driving a gate and the capacitors included in the components of the entire gate drivers. As a result, unnecessary power consumption may occur, and the influence of electromagnetic waves may be caused by the power having a gate pulse modulation waveform.

SUMMARY

Various embodiments are directed to a technology that performs gate pulse modulation in a gate driver of which gate pulse output is enabled, among a plurality of gate drivers formed in a flat panel display device, thereby reducing the influence of electromagnetic waves and power consumption required for driving a liquid crystal panel.

Also, various embodiments are directed to a technology that generates a voltage having a gate pulse modulation waveform in a gate driver, and commonly provides a voltage having a gate pulse modulation waveform to output buffers for the respective output channels of the gate driver in order to generate a modulate gate pulse, thereby simplifying the chip configuration, reducing the chip size, and reducing a variation in gate pulse modulation waveform between chips.

In an embodiment, a gate driver may include: a modulation circuit configured to generate a modulated internal gate turn-on voltage by periodically maintaining and dropping a first constant voltage provided from outside, during an enable period; and a plurality of output buffers configured to commonly receive the modulated internal gate turn-on voltage, generate a modulated gate pulse having an inclined falling edge corresponding to a drop of the modulated internal gate turn-on voltage, and output the modulated gate pulse to corresponding output channels.

In an embodiment, a driving method of a gate driver may include: starting an enable period; generating a modulated internal gate turn-on voltage by performing modulation in the gate driver, the modulation including periodically maintaining and dropping a gate turn-on voltage in response to the gate turn-on voltage provided from a power supply circuit, during the enable period; commonly providing the modulated internal gate turn-on voltage to output buffers corresponding to output channels of the gate driver; and sequentially outputting a modulated gate pulse having an inclined falling edge corresponding to a drop of the modulated internal gate turn-on voltage, to the respective output buffers.

In an embodiment, a control circuit of a flat display device may include: a power supply circuit configured to provide a constant voltage; and a plurality of gate drivers configured to sequentially enable and commonly receive the constant voltage, convert a gate pulse generated therein into a modulated gate pulse during an enable period, and sequentially output the modulated gate pulse. The gate drivers may generate a modulated internal gate turn-on voltage by periodically maintaining and dropping the constant voltage during the enable period, and output the modulated gate pulse having an inclined falling edge using the modulated internal gate turn-on voltage.

DETAILED DESCRIPTION

Figure 1:
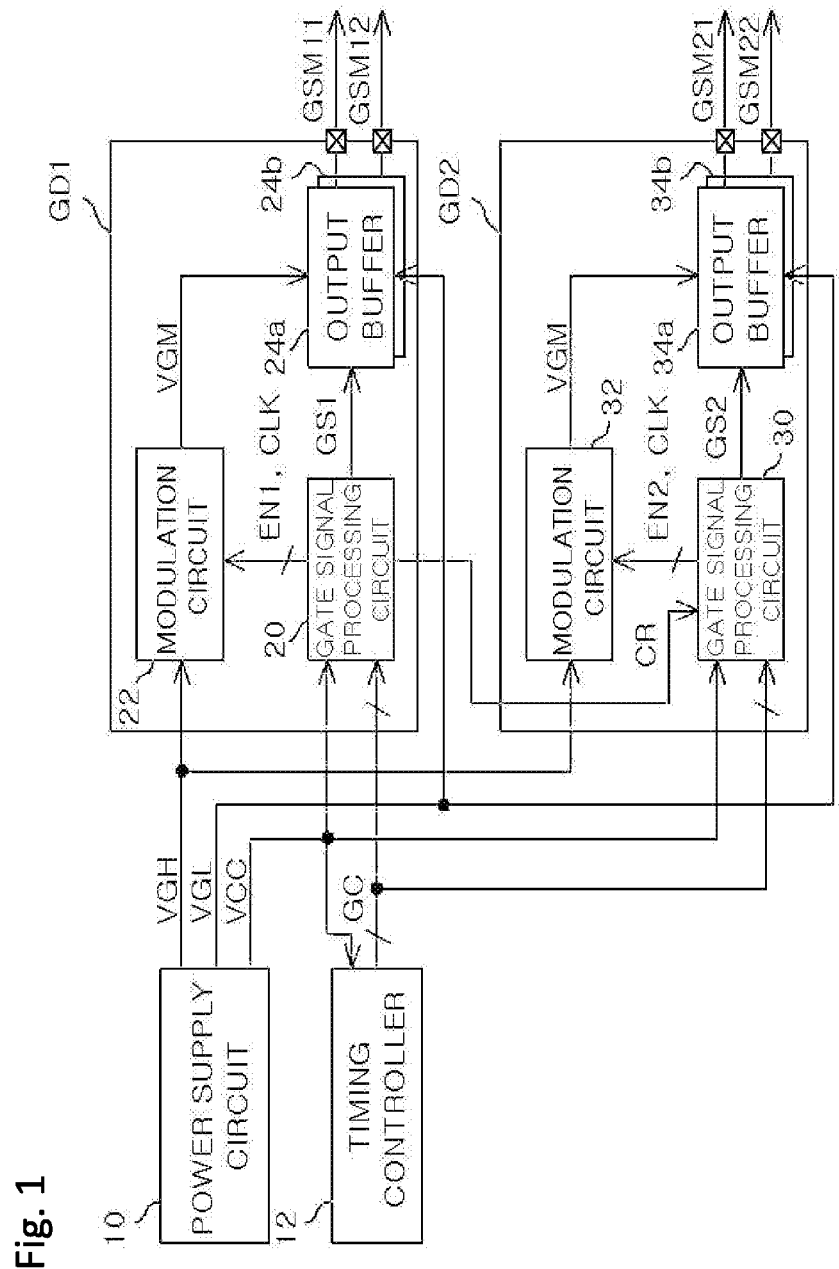
FIG. 1 is a block diagram illustrating a control circuit of a flat display device in accordance with an embodiment of the present invention.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

FIG. 1 is a block diagram illustrating a control circuit of a flat display device in accordance with an embodiment of the present invention.

The control circuit in accordance with the embodiment of FIG. 1 may include a power supply circuit 10, a timing controller 12, and gate drivers GD1 and GD2. The control circuit illustrated in FIG. 1 may be included in a driving circuit for driving a liquid crystal panel (not illustrated). The control circuit may indicate a part or all of the driving circuit.

The power supply circuit 10 may be configured to provide a voltage to a source driver (not illustrated), the gate drivers GD1 and GD2, and the timing controller 12. In particular, the power supply circuit 10 may be configured to supply an operating voltage for generating a gate pulse and a plurality of voltages for driving a gate pulse to the gate drivers GD1 and GD2. For example, the power supply circuit 10 may provide a gate turn-on voltage VGH, a gate turn-off voltage VGL, and an operating voltage VCC.

The gate turn-on voltage VGH may correspond to a voltage at a level for turning on the gate of a thin film transistor in the liquid crystal panel, and the gate turn-off voltage VGL may correspond to a voltage at a level for turning off the gate of the thin film transistor in the liquid crystal panel. Furthermore, the operating voltage VCC may correspond to a voltage at a level required for an operation of a gate signal processing circuit 20 which performs a series of processes for generating a gate signal in the gate drivers GD1 and GD2.

Among the above-described voltages, the gate turn-on voltage VGH may be provided through a high voltage power line, and the gate turn-on voltage VGH may be provided to have a constant voltage. The gate turn-on voltage VGL may be provided through a low voltage power line, and the operating voltage VCC may be formed at a lower level than the gate turn-on voltage VGH and provided through a separate power line.

The timing controller 12 may be configured to provide a source control signal and data for driving an image to the source driver, and provide a gate control signal GC for controlling generation of a gate pulse to the gate driver.

In FIG. 1, the timing controller 12 may be configured to provide a gate control signal GC including a start pulse SC and a clock signal CLK to the gate drivers GD1 and GD2. The start pulse SC may correspond to a control signal for controlling the gate driver GD1 to start generating a gate pulse, and the clock signal CLK may correspond to a signal provided for synchronization between chips.

FIG. 1 illustrates that two gate drivers GD1 and GD2 are included. However, according to the size and resolution of the liquid crystal panel, three or more gate drivers may be provided. For convenience of description, FIG. 1 illustrates two gate drivers, but does not limit the embodiment of the present invention.

The gate drivers GD1 and GD2 may sequentially output modulated gate pulses GSM11 and GSM12: GSM21 and GSM22. The gate driver GD1 may receive the start pulse SC included in the gate control signal GC from the timing controller 12, and sequentially generate the modulated gate pulses GSM11 and GSM12. The gate driver GD2 may receive a carry signal CR provided from the gate driver GD1, and sequentially generate the modulated gate pulses GSM21 and GSM22. The carry signal CR is a control signal which is provided in response to when the generation of the modulated gate pulses GSM11 and GSM12 by the gate driver GD1 is completed.

The gate driver GD1 of FIG. 1 may include a gate signal processing circuit 20, a modulation circuit 22, and output buffers 24a and 24b.

The gate signal processing circuit 20 may receive the gate control signal GC from the timing controller 12, and receive the operating voltage VCC from the power supply circuit 10. The gate signal processing circuit 20 may include a digital logic circuit (not illustrated) such as a shift register and a digital-to-analog converter (not illustrated).

The gate signal processing circuit 20 may generate an enable signal EN1 according to the start pulse SC, and generate a gate pulse GS1 in synchronization with the enable signal EN1 and the clock signal CLK. The enable signal EN1 is an internal control signal for defining an enable period in which the gate pulse GS1 is controlled to be outputted to each output channel. The gate signal processing circuit 20 may provide the enable signal EN1 and the clock signal CLK to the modulation circuit 22, and sequentially provide the gate pulse GS1 to the output buffers 24a and 24b in synchronization with the clock signal CLK.

The modulation circuit 22 may receive a constant voltage through the high voltage power line coupled to the power supply circuit 10, and the high constant voltage may correspond to the gate turn-on voltage VGH. Furthermore, the modulation circuit 22 may receive the enable signal EN1 and the clock signal CLK from the gate signal processing circuit 20.

The modulation circuit 22 may modulate the constant gate turn-on voltage VGH to have a gate pulse modulation waveform using the enable signal EN1 and the clock signal CLK. As a result, an internal gate turn-on voltage VGM may be outputted. The internal gate turn-on voltage VGM may be generated to maintain the same level as the gate turn-on voltage VGH in response to a period in which the enable signal EN1 is deactivated as described below, and generated to have a gate pulse modulation waveform in response to the enable period in which the enable signal EN1 is activated. The detailed configuration and operation of the modulation circuit 22 will be described below.

The output buffers 24a and 24b may be configured to correspond to the respective output channels of the gate driver GD1. Specifically, the gate driver GD1 may include a plurality of output buffers configured to one-to-one correspond to the output channels formed in the gate driver GD1. FIG. 1 illustrates that the gate driver GD1 includes two output buffers 24a and 24b corresponding to two output channels, for convenience of description.

The output buffers 24a and 24b may receive the internal gate turn-on voltage VGM of the modulation circuit 22 and the gate turn-off voltage VGL of the power supply circuit 10. Furthermore, the output buffers 24a and 24b may receive a gate pulse GS1 from the gate signal processing circuit 20 during the enable period of the enable signal EN1. As a result, the output buffers 24a and 24b may output the modulated gate pulses GSM11 and GSM12 using the internal gate turn-on voltage VGM.

The gate driver GD2 may receive the carry signal CR from the gate driver GD1, and receive the clock signal CLK from the timing controller 12. The gate driver GD2 may include a gate signal processing circuit 30, a modulation circuit 32, and output buffers 34a and 34b. The gate driver GD2 has the same configuration as the gate driver GD1 except that the gate driver GD2 receives the carry signal CR. Thus, the detailed descriptions thereof are omitted herein.

The modulation circuit 22 may be described in more detail with reference to FIG. 2. The modulation circuit 22 may include a switching controller 40 and switches 44 and 46. The switches 44 and 46 are configured as a switching circuit 42 for outputting the internal gate turn-on voltage VGM.

Among the components, the switching controller 40 may be configured to receive the enable signal EN1 and the clock signal CLK and output switching control signals SW1 and SW2. More specifically, the switching controller 40 may be configured to fix the states of the switching control signals SW1 and SW2 in a state where the enable signal EN1 is deactivated, generate the switching control signals SW1 and SW2 which are toggled in synchronization with the clock signal CLK during the enable period where the enable signal EN is activated, and provide the switching control signals SW1 and SW2 to the switches 44 and 46, respectively. The switching control signals SW1 and SW2 may be provided to alternately drive the switches 44 and 46 during the enable period.

First, the switching controller 40 may provide the fixed switching control signals SW1 and SW1 such that the switch 44 maintains the turn-on state and the switch 46 maintains the turn-off state in a state where the enable signal EN1 is deactivated. Thus, the switch 44 may be turned on to output the internal gate turn-on voltage VGM having a level at which the gate turn-on voltage VGH is maintained.

When the enable signal EN1 is deactivated, it may indicate that the gate driver GD1 is disabled, and when the enable signal EN1 is activated, it may indicate that the gate driver GD1 is enabled. The internal gate turn-on voltage VGM may be provided to the output buffers 24a and 24b in response to the state in which the gate driver GD1 is disabled. At this time, the internal gate turn-on voltage VGM may be provided as a constant voltage which does not have a gate pulse modulation waveform.

The switching controller 40 may provide the switching control signals SW1 and SW1 to alternately turn on the switches 44 and 46 during the enable period in which the enable signal EN1 is activated. For example, the switching controller 40 may provide the switching control signals SW1 and SW1 such that the switch 44 is turned on during a half period of the clock signal CLK and the switch 46 is turned on during the other half period. Thus, the internal gate turn-on voltage VGM may drop from the level of the gate turn-on voltage VGH during the period in which the switch 46 is turned on. Furthermore, the internal gate turn-on voltage VGM may maintain the level of the gate turn-on voltage VGH during the period in which the switch 44 is turned on. As the switches 44 and 46 are alternately turned on and off by periods, the internal gate turn-on voltage VGM having a gate pulse modulation waveform may be commonly provided to the output buffers 24a and 24b. Hereafter, the internal gate turn-on voltage VGM having a gate pulse modulation waveform in response to the enable period in which the enable signal EN1 is enabled may be referred to as the modulated internal gate turn-on voltage VGM.

The extent to which the level of the modulated internal gate turn-on voltage VGM drops in response to the turn-on of the switch 46, that is, the inclination at which the level of the modulated internal gate turn-on voltage VGM drops may be adjusted by controlling a bias voltage or bias current for the turned-on switch 46. FIG. 2 illustrates that the bias voltage is controlled by the value of a resistor Rc to which the gate turn-off voltage VGL is applied to control the inclination at which the modulated internal gate turn-on voltage VGM drops. The resistor Rc may be mounted inside or outside the chip or the gate driver GD1. Furthermore, the Rc may be commonly coupled to a plurality of gate drivers, in order to control the bias voltage.

Figure 2:
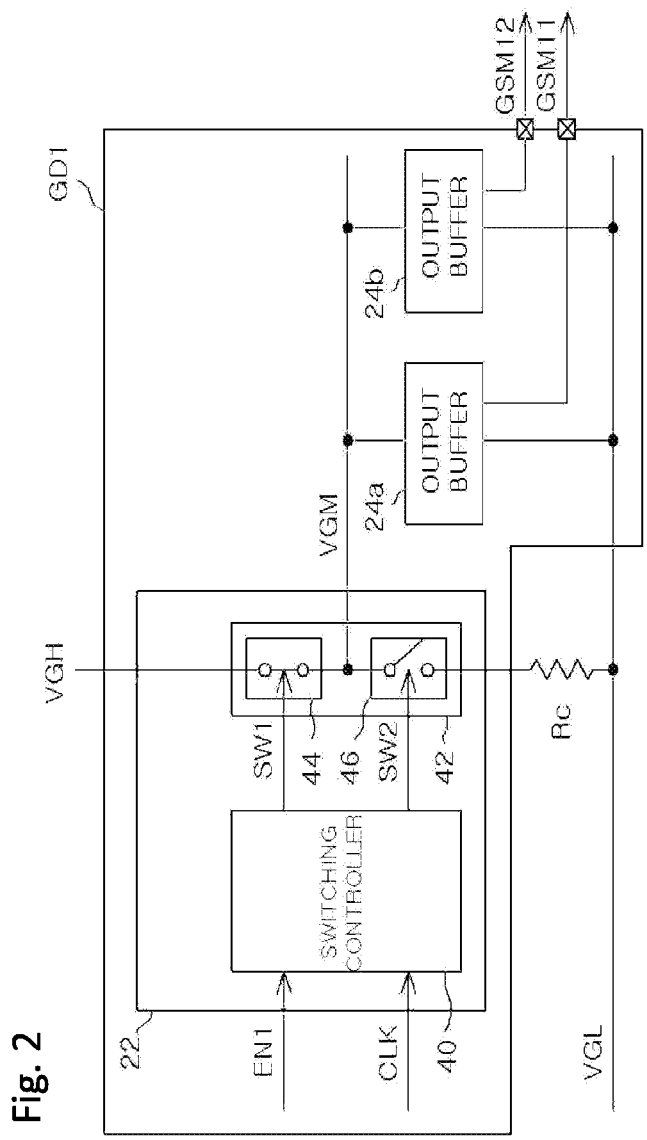
FIG. 2 is a block diagram illustrating an embodiment of a gate driver of FIG. 1.

In the embodiment of FIG. 2, an inclination controller may be defined to control the inclination at which the level of the modulated internal gate turn-on voltage VGM drops. The inclination controller may include the switch 46 and use the resistor Rc.

Figure 7:
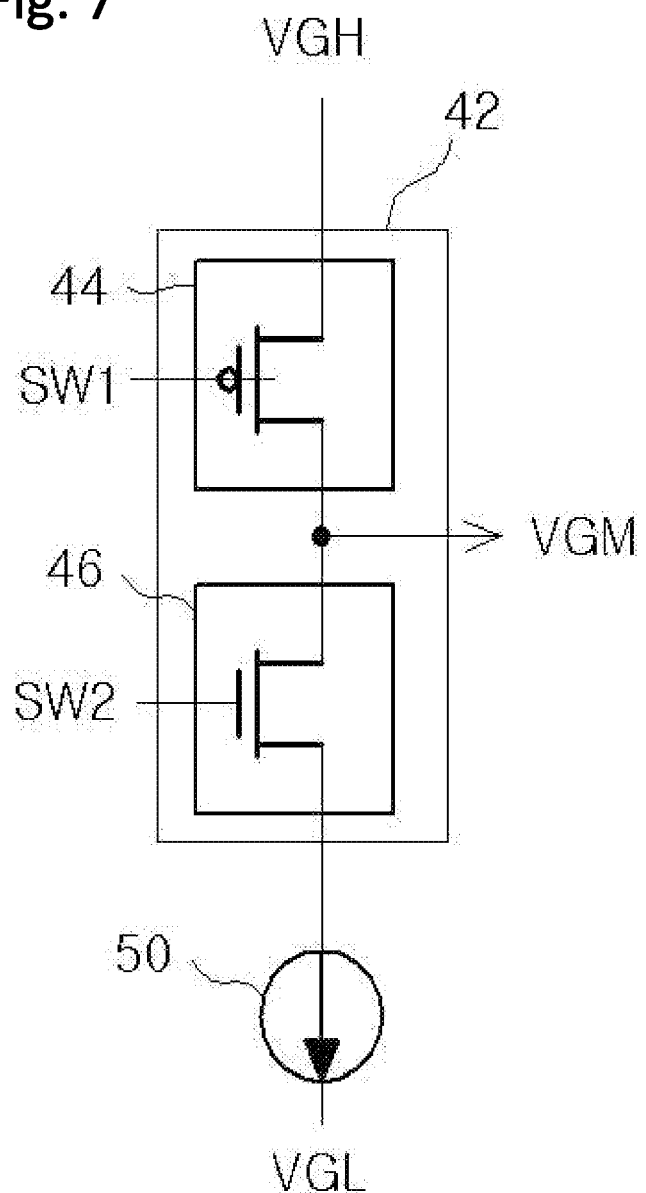
FIG. 7 is a circuit diagram illustrating an embodiment of a modulation circuit using a current controller.
Figure 8:
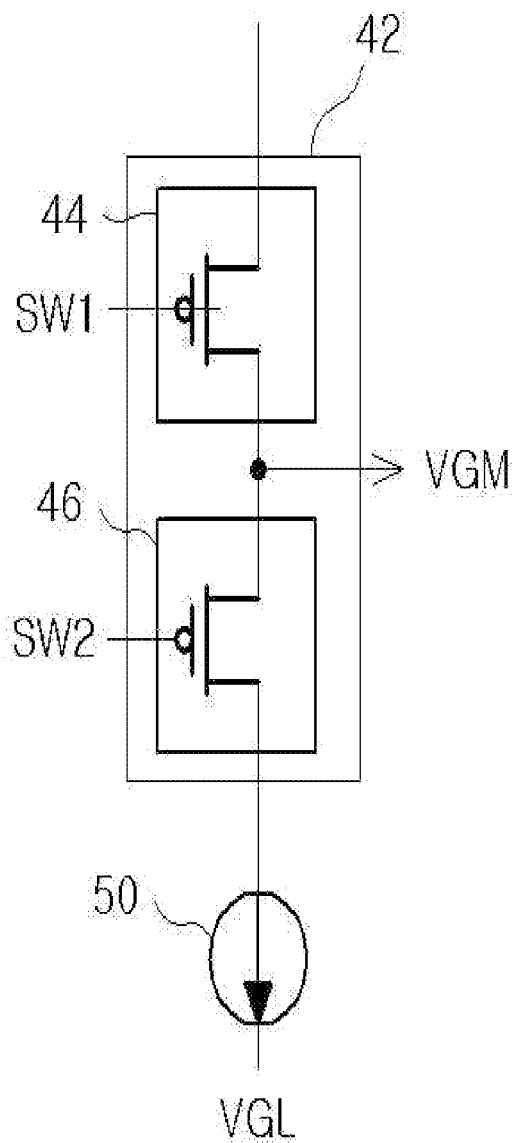
FIG. 8 is a circuit diagram illustrating another embodiment of the modulation circuit using a current controller.
Figure 9:
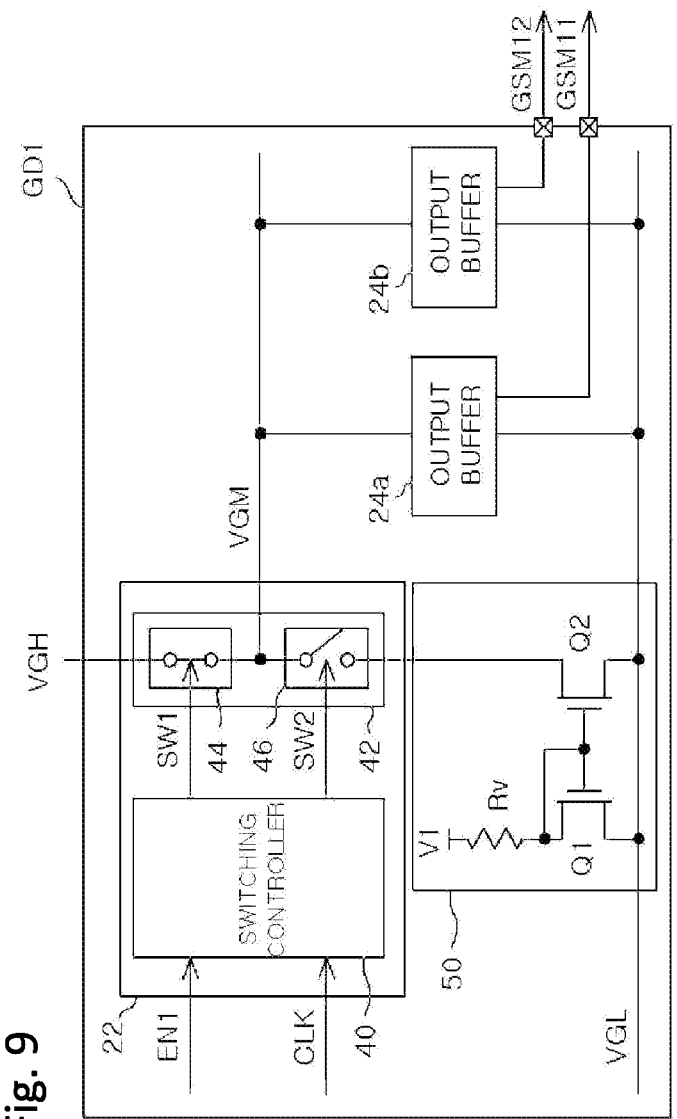
FIG. 9 is a circuit diagram illustrating another embodiment of the gate driver of FIG. 1.

Furthermore, in order to control the inclination at which the modulated internal gate turn-on voltage VGM drops, a bias current may be controlled as illustrated in FIGS. 7 to 9.

Figure 3:
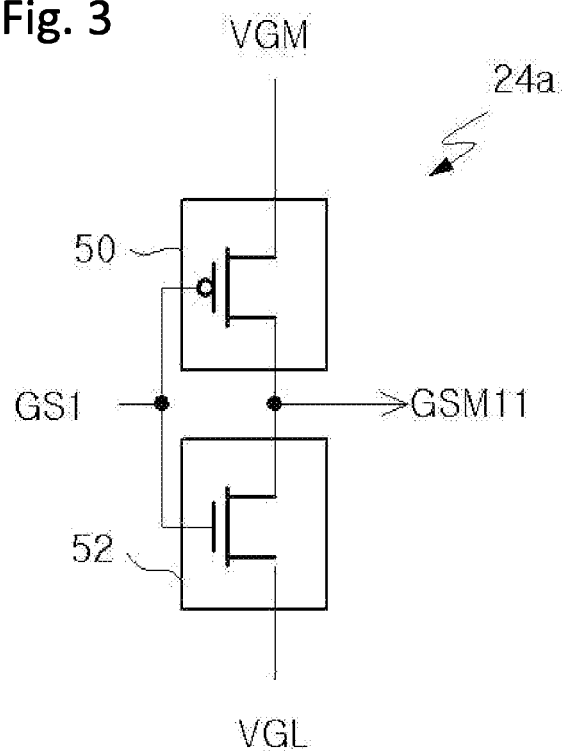
FIG. 3 is a circuit diagram illustrating an embodiment of an output buffer of FIG. 2.

As illustrated in FIG. 3, each of the output buffers 24a and 24b may include a pull-up unit 50 implemented with a PMOS transistor and a pull-down unit 52 implemented with an NMOS transistor.

The output buffer 24a may receive the gate pulse GS1 from the gate signal processing circuit 20, and the gate pulse GS1 may be provided to the pull-up unit 50 and the pull-down unit 52. When the gate pulse GS1 is applied at a low level, a pull-up operation of the pull-up unit 50 may be performed, and when the gate pulse GS1 is applied at a high level, a pull-down operation of the pull-down unit 52 may be performed. The output buffer 24a may output the modulated gate pulse GSM11 corresponding to the gate pulse GS1 according to the modulated internal gate turn-on voltage VGM during the pull-up operation, and output the modulated gate pulse GSM11 corresponding to the gate pulse GS1 according to the gate turn-off voltage VGL during the pull-down operation. The modulated gate pulse GSM11 may have an inclination at which the voltage level drops due to the influence of the modulated internal gate turn-on voltage VGM during the pull-up operation of the output buffer 24a, that is, during a period including a falling edge.

The output buffer 24b may have the same structure as the output buffer 24a and perform the same operation as the output buffer 24a. Thus, the detailed descriptions thereof are omitted herein.

Figure 4:
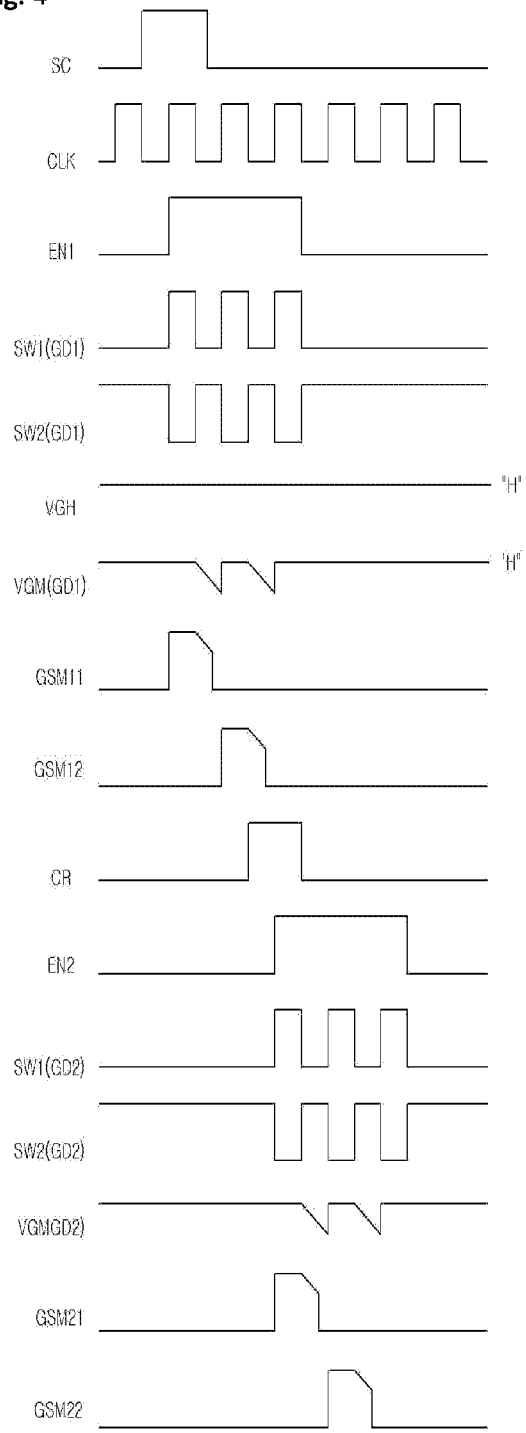
FIG. 4 is a waveform diagram for explaining an operation process of FIG. 1.

The operation of the embodiment of the present invention, which is configured as illustrated in FIGS. 1 to 3, will be described with reference to FIG. 4. The gate driver GD1 sequentially outputs the modulated gate pulses GSM11 and GSM12 according to the start pulse SC, and the gate driver GD2 then sequentially outputs the modulated gate pulses GSM21 and GSM22 according to the carry signal CR.

The gate signal processing circuit 20 of the gate driver GD1 generates the enable signal EN1 in synchronization with the clock signal CLK when the start pulse SC is received. The enable signal EN1 is generated to maintain an active state during the time required for sequentially outputting the modulated gate pulses GSM11 and GSM12 to the respective output channels of the gate driver GD1, that is, during the enable period. FIG. 4 illustrates that the enable signal EN1 is maintained to include two periods of the clock signal CLK, which correspond to two channels.

The modulation circuit 22 may receive the enable signal EN1 and the clock signal CLK.

The switching controller 40 may fix the levels of the switching control signals SW1 and SW1 and output the switching control signals SW1 and SW1 in response to deactivation of the enable signal EN1, such that the switch 44 maintains the turn-on state and the switch 46 maintains the turn-off state. The levels of the switching control signals SW1 and SW2 may be fixed to the high or low level according to whether the switches 44 and 46 are implemented with an NMOS or PMOS transistor. Thus, the modulation circuit 22 may output the internal gate turn-on voltage VGM as the gate turn-on voltage VGH, which maintains a constant voltage at the high level H, through the switch 44 which maintains a turn-on state in response to deactivation of the enable signal EN1. On the other hand, the switching controller 40 may provide the switching control signals SW1 and SW2 to alternately drive the switches 44 and 46, in response to the enable period in which the enable signal EN1 is activated. The toggling states of the switching control signals SW1 and SW2 may be synchronized with the clock signal CLK.

During the enable period in which the enable signal EN1 is activated, the switches 44 and 46 may be alternately driven in response to the switching control signals SW1 and SW2 synchronized with the clock signal CLK, and the modulation circuit 22 may drop the level of the modulated internal gate turn-on voltage VGM during the period in which the switch 46 is turned on, and commonly provide the modulated gate turn-on voltage VGM to the output buffers 24a and 24b.

The gate pulse GS1 is sequentially provided in order of the output buffer 24a and the output buffer 24b. Thus, after the output buffer 24a outputs the modulated gate pulse GSM11 corresponding to the gate pulse GS1, the output buffer 24b may output the modulated gate pulse GSM12 corresponding to the gate pulse GS1. At this time, each of the modulated gate pulses GSM11 and GSM12 may be outputted as a waveform having an inclination at falling edges of the modulated internal gate turn-on voltage VGM.

When the modulated gate pulses GSM11 and GSM12 of the gate driver GD1 are completely outputted, the gate signal processing circuit 20 of the gate driver GD1 may generate the carry signal CR, and provide the generated carry signal CR to the gate signal processing circuit 30 of the gate driver GD2.

The gate driver GD2 may sequentially output the modulated gate pulses GSM21 and GSM22 in response to the carry signal CR.

More specifically, the gate signal processing circuit 30 of the gate driver GD2 may generate an enable signal EN2 in synchronization with the clock signal CLK when the carry pulse CR is received. The enable signal EN2 may be generated to maintain an active state during the time required for sequentially outputting the modulated gate pulses GSM11 and GSM12 to the respective output channels of the gate driver GD2, that is, during the enable period.

The modulation circuit 32 may receive the enable signal EN1 and the clock signal CLK.

The modulation circuit 32 may output the gate turn-on voltage VGH, which is a constant voltage in the high level state H, as the internal gate turn-on voltage VGM in response to the period in which the enable signal EN2 is deactivated, like the above-described modulation circuit 22.

Furthermore, the modulation circuit 32 may output the modulated internal gate turn-on voltage VGM in response to the enable period of the enable signal EN2.

Figure 5:
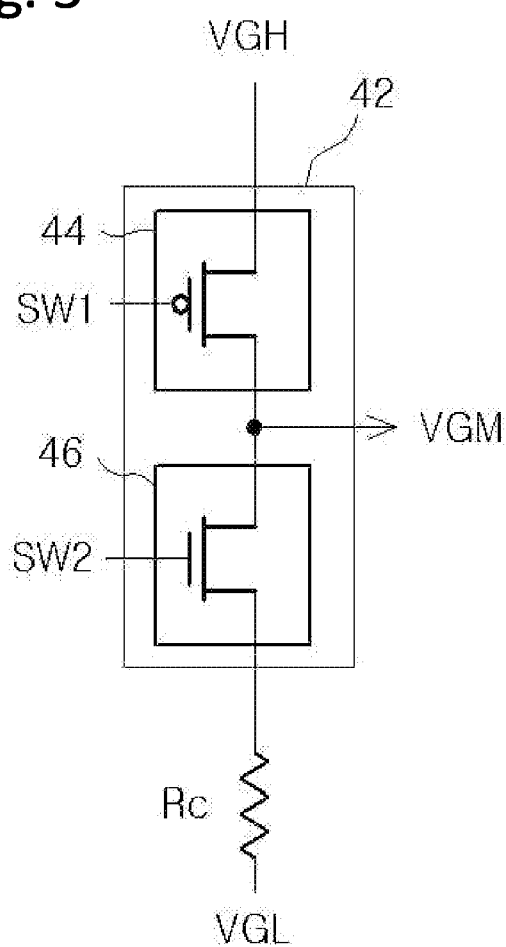
FIG. 5 is a circuit diagram illustrating an embodiment of a modulation circuit using a resistor.
Figure 6:
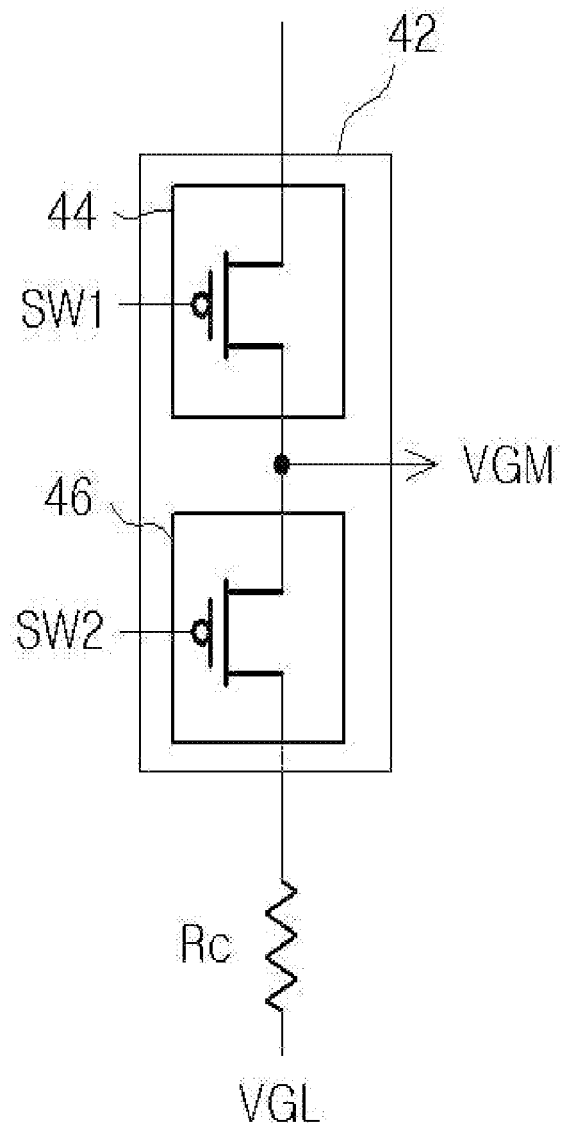
FIG. 6 is a circuit diagram illustrating another embodiment of the modulation circuit using a resistor.

Thus, the output buffer 34a may output the modulated gate pulse GSM21 corresponding to the gate pulse GS2, and the output buffer 34b may then output the modulated gate pulse GSM22 corresponding to the gate pulse GS2. At this time, the modulated gate pulses GSM21 and GSM22 may be outputted as waveforms having an inclination at falling edges of the modulated internal gate turn-on voltage VGM. As illustrated in FIG. 5, the switches 44 and 46 forming the switching circuit 42 in accordance with the embodiment of the present invention may be implemented with a PMOS transistor and an NMOS transistor, respectively. In this case, the switching control signals SW1 and SW2 may be provided at the same level, unlike in FIG. 4. In response to deactivation of the enable signal, the switching control signals SW1 and SW2 may be provided at the low level. Furthermore, the switching control signals SW1 and SW2 may be repetitively toggled between the low level and the high level such that the modulated gate turn-on voltage VGM has a period in which the level thereof drops during the enable period. The switching control signals SW1 and Sw2 may be provided at the high level when the modulated internal gate turn-on voltage VGM drops. As illustrated in FIG. 6, the switches 44 and 46 forming the switching circuit 42 in accordance with the embodiment of the present invention may be implemented with a PMOS transistor. In this case, the switching control signals SW1 and SW2 may be toggled in the opposite manner to FIG. 4. That is, the switching control signal SW2 may be provided at the low level when the modulated internal gate turn-on voltage VGM drops.

In the embodiment of the present invention, a bias current may be adjusted in order to control the inclination at which the modulated internal gate turn-on voltage VGM drops.

Referring to FIG. 7, the switches 44 and 46 forming the switching circuit 42 in accordance with the embodiment of the present invention may be implemented with a PMOS transistor and an NMOS transistor, respectively. Furthermore, the switch 46 may be coupled to a current controller 50 to which the gate turn-off voltage VGL is applied. The switching control signals SW1 and SW2 may be provided as illustrated in FIG. 5, and a current path including the current controller 50 may be formed in response to turn-on of the switch 46. That is, according to the bias current control operation of the current controller 50, the inclination of the modulated internal gate turn-on voltage VGM may be controlled while the modulated internal date turn-on voltage VGM is dropped.

In the embodiment of FIG. 8, the switches 44 and 46 forming the switching circuit 42 may be implemented with a PMOS transistor, and the switch 46 may be coupled to the current controller 50 to which the gate turn-off voltage VGL is applied. In this case, the switching control signals SW1 and SW2 may be provided as illustrated in FIG. 6, and a current path including the current controller 50 may be formed in response to turn-on of the switch 46. That is, he bias current control operation of the current controller 50, the inclination of the modulated internal gate turn-on voltage VGM may be controlled while the modulated internal gate turn-on voltage VGM is dropped.

Furthermore, as illustrated in FIG. 9, the resistor Rc of FIG. 2 may be replaced with the current controller 50. The current controller 50 of FIG. 9 may correspond to the detailed circuit diagram of the current controller 50 of FIGS. 7 and 8.

Referring to FIG. 9, the current controller 50 may be implemented with a current mirror circuit. The current controller 50 may include a resistor Rv, an NMOS transistor Q1, and an NMOS transistor Q2. The NMOS transistor Q1 and the NMOS transistor Q2 may have drains configured to commonly receive the gate turn-off voltage VGL and gates coupled to each other. Furthermore, the NMOS transistor Q1 may have a source coupled to the gate and the resistor Rv, the resistor Rv may be configured to receive a constant voltage V1, and the NMOS transistor Q2 may have a source coupled to the switch 42.

The current controller 50 configured in the above-described manner may perform a current bias control operation based on a current mirror structure for controlling the amount of current flowing in the transistor Q2 in proportion to the amount of current flowing in the transistor Q1. Thus, when the current controller 50 changes the constant voltage V1, the amount of current flowing in the transistor Q2 may be controlled, an inclination period in which the modulated internal gate turn-on voltage VGM drops may be formed, and the inclination may be proportional to the current amount.

The other components of FIG. 9 are configured and operated in the same manner as FIG. 2. Thus, the detailed descriptions thereof are omitted.

In FIGS. 7 to 9, an inclination controller may be defined to control the inclination at which the level of the modulated internal gate turn-on voltage VGM drops. The inclination controller may include the switch 46, and use the current controller 50. Furthermore, the current controller 50 may be mounted inside or outside of the chip or the gate driver GD1. Furthermore, the current controller 50 may be commonly coupled to a plurality of gate drivers in order to control a bias voltage.

As the gate pulse modulation technology is applied to the gate driver in accordance with the embodiment of the present invention, the gate pulse for driving a pixel may be stabilized to improve the image quality.

In the embodiment of the present invention, the gate pulse modulation technology may be applied to the gate driver, and the gate driver may generate the modulated internal gate turn-on voltage for modulating the gate pulse therein in response to the enable state for outputting a gate pulse. Thus, the charge and discharge by the gate pulse modulation waveform do not occur on the high-voltage power line coupled to the outside of the gate driver and the components of the entire gate drivers. As a result, unnecessary power consumption may be reduced, and the influence of electronic waves by the power of the gate pulse modulation waveform may be reduced.

Furthermore, the embodiment of the present invention may be configured to commonly provide the modulated gate turn-on voltage to the output buffers corresponding to the respective channels in the gate driver. That is, the gate driver may gate pulse modulation using one modulation circuit therein. Thus, the internal configuration of the gate driver may be simplified, and the gate driver may have an advantage in terms of chip size, and reduce a variation in gate pulse modulation waveform between chips.

In accordance with the embodiments of the present invention, since the enabled gate driver can perform gate pulse modulation, a voltage having a gate pulse modulation waveform is restrictively generated from the enabled gate driver. Thus, the influence of electromagnetic waves and the power consumption required for driving the liquid crystal panel may be improved.

Furthermore, a voltage having a gate pulse modulation waveform and generated in the gate driver can be commonly provided to the output buffers for the respective channels. Thus, the chip configuration may be simplified, the size may be reduced, and a variation in gate pulse modulation waveform between chips may be reduced.

While various embodiments have been described above, it will be understood to those skilled in the art that the embodiments described are by way of example only. Accordingly, the disclosure described herein should not be limited based on the described embodiments.

What is claimed is:

1. A gate driver comprising:
   a modulation circuit configured to generate a modulated internal gate turn-on voltage by periodically maintaining and dropping a first constant voltage provided from outside, during an enable period, wherein the modulation circuit starts the enable period according to any one of a start pulse provided from a timing controller and a carry signal provided from another gate driver; and
   a plurality of output buffers configured to commonly receive the modulated internal gate turn-on voltage, generate a modulated gate pulse having an inclined falling edge corresponding to a drop of the modulated internal gate turn-on voltage, and output the modulated gate pulse to corresponding output channels.

2. The gate driver of claim 1, wherein the gate driver uses a gate turn-on voltage as the first constant voltage.

3. The gate driver of claim 1, wherein the modulation circuit generates the modulated internal gate turn-on voltage in synchronization with a clock signal.

4. The gate driver of claim 1, wherein the modulation circuit comprises:
   a switching controller configured to provide a first switching control signal and a second switching control signal which are toggled in synchronization with a clock signal, during the enable period;
   a first switch configured to maintain and output the modulated internal gate turn-on voltage at a level of the first constant voltage in response to the first switching control signal; and
   an inclination controller configured to drop a level of the modulated internal gate turn-on voltage in response to the second switching control signal, and control an inclination at which the level of the modulated internal gate turn-on voltage is dropped, and
   the first switch and the inclination controller are alternately driven in response to the first switching control signal and the second switching control signal, respectively.

5. The gate driver of claim 4, wherein the inclination controller comprises a second switch configured to drop and output the level of the modulated internal gate turn-on voltage using a second constant voltage having a lower level than the first constant voltage according to the second switching control signal.

6. The gate driver of claim 5, wherein the gate driver uses a gate turn-off voltage as the second constant voltage.

7. The gate driver of claim 5, wherein the inclination at which the level of the modulated internal gate turn-on voltage is dropped is controlled by a bias voltage of a resistor.

8. The gate driver of claim 5, wherein the inclination controller uses a resistor provided inside or outside a chip and configured to receive the second constant voltage, and the resistor is shared by two or more gate drivers.

9. The gate driver of claim 4, wherein the inclination controller comprises a second switch configured to drop and output the level of the modulated internal gate turn-on voltage using a second constant voltage having a lower level than the first constant voltage according to the second switching control signal, and controls the inclination using a current controller provided inside or outside a chip and configured to provide a current path for controlling a current and provide the second constant voltage to the second switch through the current path.

10. The gate driver of claim 9, wherein the second switch is configured to control the inclination using the current controller based on a current mirror method.

11. The gate driver of claim 9, wherein the inclination at which the level of the modulated internal gate turn-on voltage is dropped is controlled by the current of the current controller.

12. The gate driver of claim 9, wherein the current controller is shared by two or more gate drivers.

13. A driving method of a gate driver, comprising:
starting an enable period;
generating a modulated internal gate turn-on voltage by performing modulation in the gate driver, the modulation including periodically maintaining and dropping a gate turn-on voltage in response to the gate turn-on voltage provided from a power supply circuit, during the enable period, wherein the enable period is started according to any one of a start pulse provided from a timing controller and a carry signal provided from another gate driver;
commonly providing the modulated internal gate turn-on voltage to output buffers corresponding to output channels of the gate driver; and
sequentially outputting a modulated gate pulse having an inclined falling edge corresponding to a drop of the modulated internal gate turn-on voltage, to the respective output buffers.

14. A control circuit of a flat display device, comprising:
a power supply circuit configured to provide a constant voltage; and
a plurality of gate drivers configured to sequentially enable and commonly receive the constant voltage, convert a gate pulse generated therein into a modulated gate pulse during an enable period, and sequentially output the modulated gate pulse,
wherein the gate drivers generate a modulated internal gate turn-on voltage by periodically maintaining and dropping the constant voltage during the enable period, and output the modulated gate pulse having an inclined falling edge using the modulated internal gate turn-on voltage, and wherein the enable period is started according to any one of a start pulse provided from a timing controller and a carry signal provided from another gate driver.

15. The control circuit of claim 14, wherein each of the gate drivers comprises:
a modulation circuit configured to generate the modulated internal gate turn-on voltage by periodically maintaining and dropping the constant voltage, during the enable period; and
a plurality of output buffers configured to commonly receive the modulated internal gate turn-on voltage, and generate and output the modulated gate pulse having an inclined falling edge corresponding to a drop of the modulated internal gate turn-on voltage.

* * * * *